US007638161B2

(12) United States Patent
Mukai et al.

(10) Patent No.: US 7,638,161 B2
(45) Date of Patent: Dec. 29, 2009

(54) METHOD AND APPARATUS FOR CONTROLLING DOPANT CONCENTRATION DURING BPSG FILM DEPOSITION TO REDUCE NITRIDE CONSUMPTION

(75) Inventors: Kevin Mukai, Santa Clara, CA (US); Shankar Chandran, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 514 days.

(21) Appl. No.: 09/910,583

(22) Filed: Jul. 20, 2001

(65) Prior Publication Data
US 2003/0017267 A1    Jan. 23, 2003

(51) Int. Cl.
C23C 16/22 (2006.01)
C23C 16/00 (2006.01)

(52) U.S. Cl. ............ 427/96.8; 427/255.38; 427/255.37; 427/96.1; 427/97.1; 427/99.2

(58) Field of Classification Search ............ 427/255.37, 427/255.38, 255.7, 372.2; 438/760, 763, 438/787
See application file for complete search history.

(56) References Cited

U.S. PATENT DOCUMENTS

| 4,557,950 A | 12/1985 | Foster et al. |
| 5,094,984 A | 3/1992 | Liu et al. |
| 5,356,722 A | 10/1994 | Nguyen et al. |
| 5,656,556 A | 8/1997 | Yang |
| 5,994,209 A | 11/1999 | Yieh et al. |
| 6,030,445 A | 2/2000 | Gregg et al. |
| 6,091,121 A | 7/2000 | Oda |
| 6,099,647 A | 8/2000 | Yieh et al. |
| 6,110,556 A | 8/2000 | Bang et al. |
| 6,117,244 A | 9/2000 | Bang et al. |
| 6,121,164 A | 9/2000 | Yieh et al. |
| 6,159,870 A | 12/2000 | Chakravarti et al. |
| 6,177,344 B1 | 1/2001 | Xia et al. |
| 2002/0000195 A1 | 1/2002 | Bang et al. |

FOREIGN PATENT DOCUMENTS

EP    0 843 348 A2    5/1998

(Continued)

OTHER PUBLICATIONS

Adrian J. Murrell et al., "Characterisation of Ultra-Shallow Junctions Using Advanced SIMS, SRP and HRTEM Techniques" Publication, pp. 1-5.

(Continued)

Primary Examiner—David Turocy
(74) Attorney, Agent, or Firm—Blakely, Sokoloff, Taylor & Zafman

(57) ABSTRACT

A method and apparatus for controlling dopant concentration during borophosphosilicate glass film deposition on a semiconductor wafer to reduce consumption of nitride on the semiconductor wafer. In one embodiment of the invention, the method starts by placing a substrate having a nitride layer in a reaction chamber and providing a silicon source, an oxygen source and a boron source into the reaction chamber while delaying providing a phosphorous source into the reaction chamber to form a borosilicate glass layer over the nitride layer. The method continues by providing the silicon, oxygen, boron and phosphorous sources into the reaction chamber to form a borophosphosilicate film over the borosilicate glass layer.

3 Claims, 6 Drawing Sheets

FOREIGN PATENT DOCUMENTS

| | | | |
|---|---|---|---|
| EP | 843348 A2 | * | 5/1998 |
| EP | 1139403 A1 | * | 10/2001 |
| KR | 10-2001-0055915 | | 7/2001 |
| KR | 2001055915 A | * | 7/2001 |

OTHER PUBLICATIONS

Kern, Werner, et al., Simultaneous deposition and fusion flow planarization of borophosphosilicate glass in a new chemical vapor deposition reactor, Thin Solid Films, Elsevier-Sequoia S.A., Lausanne, CH, vol. 206, No. 1/2, Dec. 10, 1991, pp. 64-69, XP000355313, ISSN: 0040-6090.

Robles, Stuardo, et al., Gap Fill and Film Reflow Capability of Subatmospheric Chemical Vapor Deposited Borophosphosilicate Glass, Reprinted from Journal Of The Electrochemical Society, vol. 143, No. 4, Apr. 1996, © 1995, pp. 1414-1421.

Xia, L.-Q, et al., Process Characteristics for Subatmospheric Chemical Vapor Deposited Borophosphosilicate Glass and Effect of Carrier Gas, Reprinted from Journal Of The Electrochemical Society, vol. 144, No. 9, Sep. 1997, © 1997, pp. 3208-3212.

Xia, L.-Q., et al., High Aspect Ratio Trench Filling Using Two-Step Subatmospheric Chemical Vapor Deposited Borophosphosilicate Glass for <0.18 μm Device Application, Journal of The Electrochemical Society, Manchester, New Hampshire, U.S.A., vol. 146, No. 5, May 1999, pp. 1884-1888, XP001002961, ISSN: 0013-4651.

Search Report for PCT/US 02/22608, mailed Nov. 7, 2002, 4 pages.

Search Report for PCT/US 02/23520, mailed Nov. 25, 2002, 5 pages.

* cited by examiner

METHOD AND APPARATUS FOR CONTROLLING DOPANT CONCENTRATION DURING BPSG FILM DEPOSITION TO REDUCE NITRIDE CONSUMPTION

BACKGROUND OF THE INVENTION

1. Field of the Invention

The present invention relates generally to the filed of substrate processing for semiconductor manufacturing and more specifically to an improved method for controlling dopant concentration during borophosphosilicate glass (BPSG) film deposition on a semiconductor wafer to reduce consumption of nitride layer on the semiconductor wafer.

2. Description of Related Art

Silicon oxide is widely used as an insulating layer in the manufacture of semiconductor devices. For a number of years, boron and phosphorous doped silicate films, such as borophosphosilicate glass (BPSG) films, deposited with liquid sources such as tetraethylorthosilicate (TEOS), have gained preference among silicon oxide films for their superior gap filling capability upon glass reflow.

BPSG films are generally deposited on a silicon wafer or substrate by thermal or plasma enhanced chemical vapor deposition (CVD) processes from a reaction of an oxygen-containing source such as ozone ($O_3$), with a silicon-containing source, such as TEOS, conducted in atmospherically-controlled heated reactor or chamber. For BPSG films, dopants such as boron in the form of triethylborate (TEB) and phosphorous in the form of triethylphosphate (TEPO) are also introduced in the reaction chamber during ozone/TEOS reaction. In general, reaction rates in thermal and plasma CVD processes may be controlled by controlling one or more of the following: temperature, pressure, reactant gas flow rate and radio-frequency (RF) power.

The reactants, e.g. TEOS, TEB, TEPO, are typically converted from a solid or liquid state into a gaseous or vapor state by a precision liquid injection (PLI) system to achieve a high degree of uniformity by vapor deposition. The precursor vapor, once generated, is directed into the reaction chamber, to form a deposited layer on the substrate. Current generation precision liquid injection systems provide imprecise control of dopants TEB and TEPO into the reaction chamber. Furthermore, these dopants are generally introduced into the deposition chamber at the same time using current generation PLI systems.

Typically, a BPSG film is deposited on a semiconductor device/substrate over of a layer/film of silicon nitride ($Si_3N_4$) which functions as an etch stop or spacer during the manufacture of the integrated circuit. Following deposition, the BPSG film generally undergoes a reflow step with wet (e.g. steam) annealing at a temperature of about 800-900° C. in order to planarize the BPSG layers and to fill in any voids that may be present in the BPSG layer/film. During the steam anneal phase, boron and phosphorous dopants present in the BPSG layer start migrating within the layer, generally resulting in a high concentration of free phosphorous atoms near the nitride layer. Studies have shown that the free phosphorous in the initial BPSG film in reaction with water vapors from the steam anneal process forms phosphoric acid ($H_3PO_4$) which is a well known etching agent for stripping nitride. Inconsistent dopant concentration, particularly at interfaces with other materials, results in inconsistent processing and defective device formations.

Thus, there is a need for a method for selectively controlling boron and phosphorous dopant concentration deposition over a substrate, and more particularly a method for controlling phosphorous dopant deposition profile and/or distance of the phosphorous dopant from the nitride surface in order to reduce the silicon nitride layer consumption.

SUMMARY OF THE INVENTION

A method and apparatus for controlling dopant concentration during borophosphosilicate glass film deposition on a semiconductor wafer to reduce consumption of nitride on the semiconductor wafer are described. In one embodiment of the invention, the method starts by placing a substrate having a nitride layer in a reaction chamber and providing a silicon source, an oxygen source and a boron source into the reaction chamber while delaying providing a phosphorous source into the reaction chamber to form a borosilicate glass layer over the nitride layer. The method continues by providing the silicon, oxygen, boron and phosphorous sources into the reaction chamber to form a borophosphosilicate film over the borosilicate glass layer.

BRIEF DESCRIPTION OF THE DRAWINGS

The present invention is illustrated by way of example and not limitation in the accompanying figures.

DETAILED DESCRIPTION OF THE INVENTION

Figure 1:
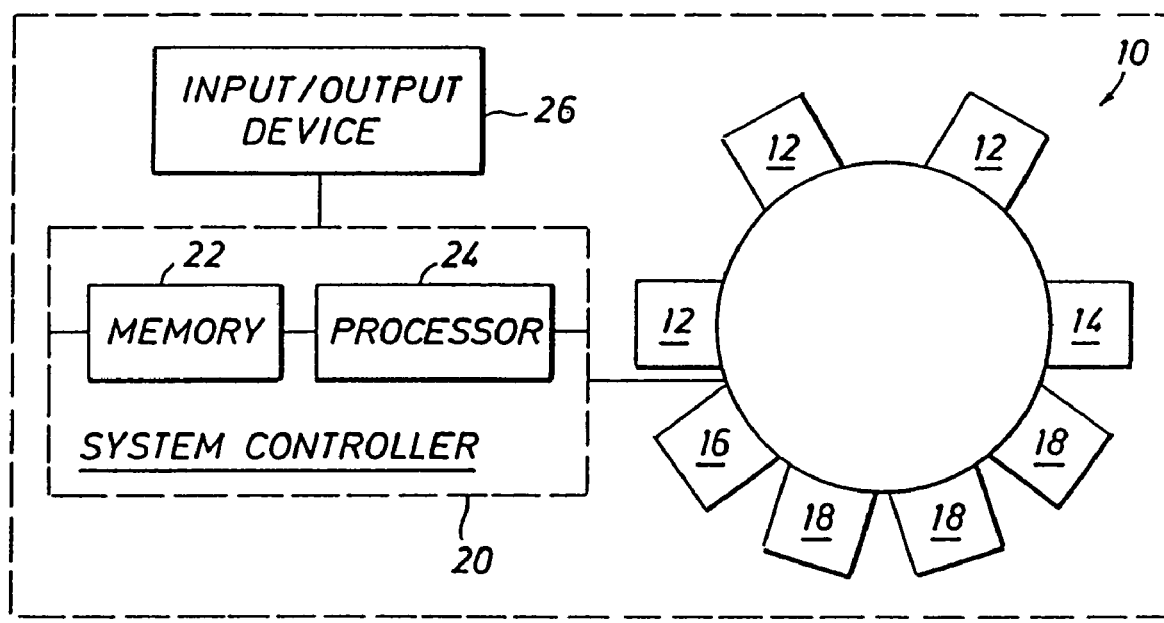
FIG. 1 schematically illustrates a diagram of an exemplary multichamber system for controlled depositing a doped silicon oxide film on a substrate to reduce nitride consumption in accordance to one embodiment of the present invention.

The present invention describes a novel method and apparatus for reducing the nitride consumption during integrated circuit manufacture. In the following detailed description numerous specific details such as apparatus configurations as well as process specifics such as time and temperature are set forth in order to provide a thorough understanding of the present invention. One skilled in the art will appreciate the ability to use alternative configuration and process details to the disclosed specifics without parting from the scope of the present invention. In other instances, well-known semiconductor processing equipment and techniques have not been described in detail in order to not unnecessarily obscure the present invention.

The present invention describes a novel method and apparatus for selectively controlling dopant concentration during borophosphosilicate glass film deposition on a semiconductor wafer to reduce nitride consumption. According to the present invention, a silicon substrate/wafer having a silicon nitride barrier layer is placed in a reaction chamber. A silicon source, an oxygen source, a boron source and a phosphorous source are provided to the reaction chamber system. In an embodiment of the present invention, the reaction chamber system includes a gas delivery system that can individually provide or inject some of the reactants (e.g. TEOS, TEB) in the reaction chamber for substrate processing while delaying providing or injecting other reactants (e.g., TEPO) in order to control-deposit various types of silicon glass films on the substrate, for example a boron rich silicon glass film, a boron/phosphorous-doped silicon glass film, etc. The gas delivery system also stabilizes reactants' flows prior to introducing them in the chamber.

In one embodiment of the invention, the method continues by injecting the silicon, oxygen and boron sources in the reaction chamber while the phosphorous source injection is delayed for a predetermined period of time to deposit a borosilicate glass (BSG) or boron-rich silicon glass film over the nitride barrier layer on the substrate. At the end of the predetermined period of time, the phosphorous source is injected in the chamber while continuing injecting the silicon, oxygen and boron sources into the chamber to deposit a borophosphosilicate glass (BPSG) film over the borosilicate glass film. Following film deposition, the substrate having the boron-rich silicon glass layer/film and BPSG layer/film deposited thereon is annealed using rapid thermal processing (RTP) or furnace heating (for batch processing) at a temperature in a range of approximately 750° C. to 1050° C. in a wet ambient of steam or water, or a wet ambient formed by in-situ reaction of $H_2$ and $O_2$, to facilitate reflow of the BPSG film (i.e., planarize film layer and fill gap/voids in film) and to control nitride consumption. The boron-rich silicon film deposited between a BPSG film and the nitride barrier layer acts as a diffusion layer to slow down reactions during steam anneal between nitride and phosphorous, thus reducing the nitride consumption during substrate processing.

FIG. 1 schematically illustrates a diagram of an exemplary substrate processing system, such as multichamber system 10 for selectively controlling dopant concentration during borophosphosilicate glass film deposition on a semiconductor wafer/substrate 50 to reduce nitride consumption according to an embodiment of the present invention. The multichamber system 10, also known as a cluster tool, has the capability to process a plurality of substrates between its chambers without breaking the vacuum and without having to expose the wafers to moisture or other contaminants outside the multichamber system 10. An advantage of the multichamber system 10 is that different chambers 12, 14, 16, 18 in the multichamber system 10 may be used for different purposes in the entire process. For example, chambers 12 may each be used for deposition of boron phosphorous silicon oxides film on a semiconductor wafer/substrate 50, chamber 14 may be used for annealing the doped silicon oxide film following deposition, and yet another chamber 16 may be used as a substrate cooldown chamber following RTP. Other chambers 18 may serve other purposes within the process, for example as an auxiliary chamber, e.g., loading/unloading substrate into multi-chamber system 10. The process may proceed uninterrupted within the multichamber system 10, thus preventing contamination of wafers that often occurs when transferring wafers between various separate individual chambers (not in a multichamber system) for different parts of a process. Performing the deposition and heating steps in the same multichamber system 10 provides better control of the thickness, uniformity, and moisture content of the doped dielectric film.

Continuing with reference to FIG. 1, a system controller 20 controls all of the activities of the substrate processing system, e.g. multichamber CVD system 10. In an embodiment of the present invention the system controller 20 includes a hard disk drive (memory 22), a floppy disk drive and a processor 24. The processor 24 contains a single board computer (SBC), analog and digital input/output boards, interface boards and stepper motor controller board. Various parts of CVD system 10 conform to the Versa Modular European (VME) standards which define board, card cage, and connector dimensions and types. The VME standard also defines the bus structure having a 16-bit data bus and 2-bit address bus.

System controller 20 executes system control software, which is a computer program stored in a computer-readable medium such as a memory 22. Preferably, memory 22 is a hard disk drive, but memory 22 may also be other kinds of memory. The computer program includes sets of instructions that dictate the timing, mixture of gases, chamber pressure, chamber temperature, lamp power levels, susceptor position, and other parameters of a particular process. Of course, other computer programs such as one stored on another memory device including, for example, a floppy disk or other another appropriate drive, may also be used to operate controller 20. An input/output device 26 such as a CRT monitor and a keyboard is used to interface between a user and controller 20.

Figure 2:
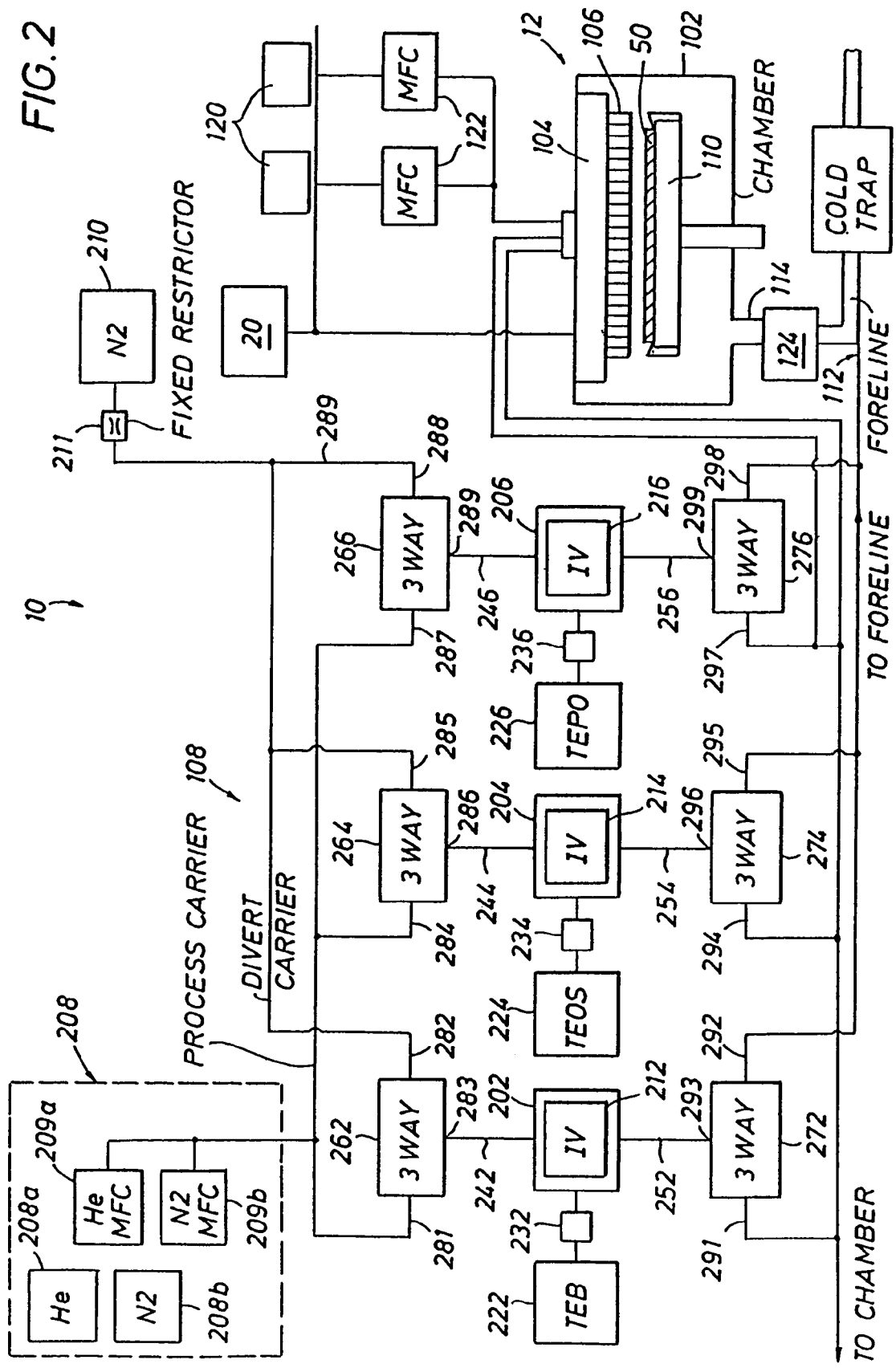
FIG. 2 illustrates an exemplary embodiment of a chamber and process gas delivery system for controlled depositing a doped silicon oxide film on a substrate that is part of the multichamber system of FIG. 1.
Figure 3:
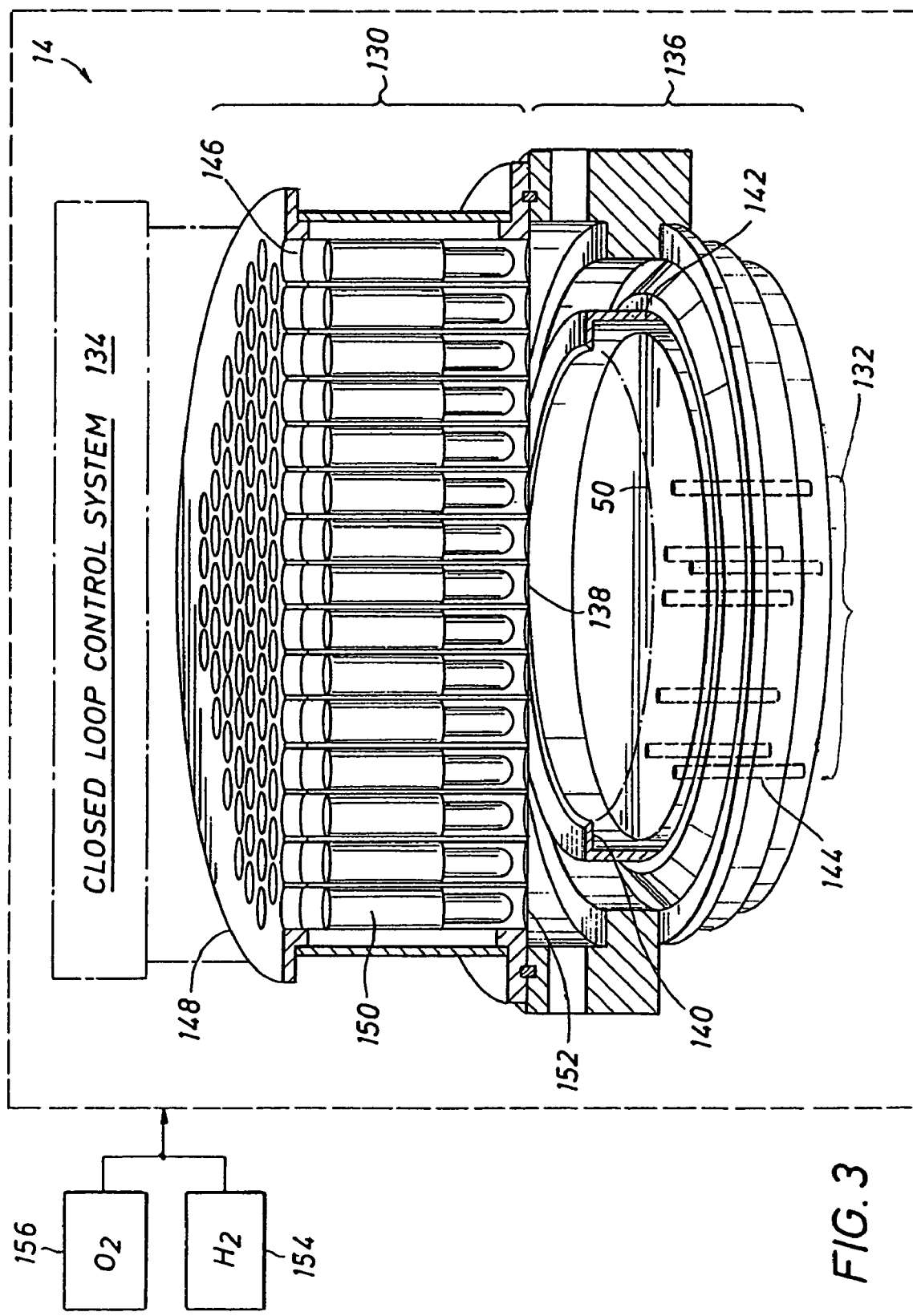
FIG. 3 illustrates an exemplary embodiment of a thermal processing chamber, such as a rapid thermal processing chamber, for reflow of a substrate following doped silicon oxide layer deposition in the multichamber system of FIG. 1.

FIGS. 2 and 3 illustrate exemplary embodiments of chambers 12, 14, 16, and 18 in the multichamber system 10 used in substrate processing. Specifically, FIG. 2 depicts a CVD chamber 12 for depositing a doped silicon oxide film layer on a substrate and a process gas delivery system, while FIG. 3 illustrates a chamber 14 for rapid thermal processing (RTP) of a substrate following doped silicon oxide film deposition. The two chambers are discussed in detail below.

It should be noted that the configuration, arrangement, hardware elements, etc. of multichamber system 10, and thus chambers 12, 14, 16, 18 shown in FIGS. 2 and 3 may vary depending on a number considerations, included but not limited to, specific sub-atmospheric chemical vapor deposition (SACVD) process implemented, substrate process specifications set by semiconductor manufacture clients, technological advances/optimizations, etc. Therefore, not all chamber hardware elements illustrated in FIGS. 2 and 3 may be included in every chamber 12, 14, 16, and 18 in the multichamber system 10.

FIG. 2 schematically illustrates a diagram of an exemplary CVD chamber, such as chamber 12, of multichamber system 10 for depositing a doped silicon oxide film layer on a substrate 50 and a process gas delivery system 108 for selectively controlling dopant concentration during BPSG glass film deposition to reduce nitride consumption according to an embodiment of the present invention.

Generally, the CVD chamber/reactor system 10 includes a chamber 102, a chamber lid 104 having a gas distributor 106, a gas delivery system 108 fluidly connected to the gas distributor 106 to deliver one or more processing gases into the chamber 102, a substrate support member 110 disposed in the chamber, a vacuum exhaust system 112 connected to a gas outlet 114 of the chamber 102, and a system controller 20 connected to control operation of the CVD system 10. Examples of CVD systems include, but are not limited to, the Applied Materials, Inc. CxZ Gigafill CVD chamber/system, the Ultima HDP-CVD chamber/system and the DxZ chamber/system.

The substrate support member 110, typically made of a ceramic, aluminum nitride, or aluminum includes a heater, such as a resistive heating coil disposed inside the substrate support member, and may also include substrate chucking mechanisms for securely holding a substrate, such as a vacuum chuck or an electrostatic chuck. The gas distributor 106 may compromise a showerhead type gas distributor or a plurality of injection nozzles, for providing a uniform process gas distribution over a substrate disposed on the substrate support member 110. A temperature control system, such as a resistive heating coil and/or thermal fluid channels, may be disposed in thermal connection with the lid and the gas distributor 106. The temperature control system maintains the temperature of the gas distributor 106 within a desired range throughout processing. The gas distributor 106 is fluidly connected to additional gas sources 120 through additional mass flow controllers (MFCs) 122.

The exhaust system 112 includes one or more vacuum pumps 124, such as a turbomolecular pump, connected to exhaust gases from and maintain vacuum levels in the chamber 102. The one or more vacuum pumps 124 are connected to the exhaust of gas outlet 114 through a valve such as a gate valve. One or more cold traps 126 are disposed on exhaust lines to remove or condense particular gases exhausted from the chamber.

The gas delivery system 108 includes one or more vaporizers connected to one or more liquid precursor sources for forming the desired film on the substrate in the chamber. FIG. 2 schematically illustrates one embodiment of a gas delivery system 108 of the invention having three vaporizers 202, 204, 206 for vaporizing three liquid precursors. Although this embodiment is described utilizing three vaporizers, it is understood that the invention contemplates other embodiments of the gas delivery system utilizing any number of vaporizers. Each vaporizer 202, 204, 206 includes an injection valve 212, 214, 216 connected to a liquid precursor source 222, 224, 226 which supplies the liquid precursor to be vaporized. The liquid precursor sources 222, 224, 226 may include one or more ampoules of precursor liquid and solvent liquid. Each ampoule is connected to the injection valve of the vaporizer through a liquid flow meter (LFM) 232, 234, 236. Optionally, a shut-off valve is disposed between each LFM and each vaporizer.

Each vaporizer 202, 204, 206 includes a carrier gas input 242, 244, 246 and a gas output 252, 254, 256. As shown in FIG. 2, each vaporizer includes an input valve 262, 264, 266 connected the carrier gas input 242, 244, 246 of the vaporizers and an output valve 272, 274, 276 connected to the gas output 252, 254, 256 of the vaporizers. The input and the output valves may include three-way valves to provide substantially instantaneous switching (i.e., less than about 10 milliseconds) between valve inputs and between valve outputs. The input valve 262, 264, 266 facilitates selection between sources of carrier gas and includes a first input 281, 284, 287 connected to a process carrier gas source 208 and a second input 282, 285, 288 connected to a divert carrier gas source 210. The output 283, 286, 289 of the input valve 262, 264, 266 is connected to and controlled by the system controller 20 to switch between the input connections 281/282, 284/285, 287/288 as described below.

The output valve 272, 274, 276 includes an input 293, 296, 299 connected to the vaporized gas output 252, 254, 256 of the vaporizer 202, 274, 276 includes a first output 291, 294, 297 connected to and controlled by the system controller 20 to switch between the output connections 291/292, 294/295, 297/298 as described below.

As shown in FIG. 2, the process carrier gas source 208 includes a helium (He) gas source 208a and a nitrogen ($N_2$) gas source 208b to the first input 281, 284, 287 of each input valve 262, 264, 266. The MFCs 209a, 209b can be set to provide a total of 6 slm (standard liter per minute) of process carrier gas (e.g., total combined helium gas at 4 slm and nitrogen gas at 2 slm) into the chamber.

The divert carrier gas source 210 is connected through a fixed flow restrictor 211 which provides a desired amount of divert carrier gas to the second input 282, 285, 288 of each input valve 262, 264, 266. The fixed flow restrictor 211 provides sufficient divert carrier gas to facilitate vaporization of liquid precursors when the vaporizers 262, 264, 266 are operating in the divert mode as discussed below. Alternatively, the divert carrier gas source can be connected through a MFC to the second input of each input valve to control the amount of divert carrier gas supplied to the vaporizers. As shown in FIG. 2, the divert carrier gas source 210 includes nitrogen gas source. Although the invention is described utilizing helium and/or nitrogen as carrier gases (process or divert) for the vaporizers, the invention contemplates utilization of a variety carrier gases, including helium, nitrogen, argon, krypton, xenon, and combinations thereof.

Although the following describes operation of the gas delivery system with respect to one vaporizer, it is understood that other vaporizers of the processing system may also operate similarly. The input valve 262 and output valve 272 connected to the vaporizer 202 operate synchronously to switch input and output of the vaporizer 202 between a process mode and a divert mode. To begin a vaporization process, the LFM is opened to allow flow from the liquid precursor source 222 into the injection valve 212 of the vaporizer 202, the input valve 212 of the vaporizer 202 is switched to receive carrier gas from the second input 282 which is connected to the divert carrier gas source 210. At the same time, the output valve 272 of the vaporizer 202 is switched to the second output 292, the vaporizer 202 is defined as operating in a divert mode. Because the LFM has an inherent delay (i.e., rise time) before liquid flow through the LFM has stabilized, and the vaporized gas output from the vaporizer is diverted to the foreline of the exhaust system during this initial vaporization period. Thus, the process gas is not introduced into the chamber during this initial period because the process gas has a concentration gradient caused by the rise time of the LFM, and the deposited film formed subsequently on a substrate in the chamber does not exhibit concentration profiles reflecting the rise of time of the LFM.

Once the liquid flow through the LFM has stabilized, the input valve 262 of the vaporizer 202 is switched to receive carrier gas from the first input 281 which is connected to the process carrier gas source 208, and the output valve 272 of the vaporizer 202 is switched to the first output 291 to direct vaporizer output 291, the vaporizer 202 is defined as operating in a process mode. In the process mode, the vaporizer 202 provides a stabilized quantity of vaporized precursor, and the resulting deposited film exhibits a consistent concentration profile.

Turning to FIG. 3, an embodiment of a chamber 14 for rapid thermal processing (RTP) of a wafer following dielectric film deposition that is part of multichamber system 10 is illustrated. The RTP chamber embodiment 14 described below generally includes four main components. The first component consists of a radiant heat source or lamp head 130. The second and third components are made up of the temperature measurement system 132 and the closed loop control system 134 which drives the lamp head 130. The fourth component is the wafer process chamber 136. A highly reflective coating is applied to the chamber bottom plate 138 using materials compatible with semiconductor processing. It will be noted that FIG. 3 details the RTP wafer process chamber 136, the lamp head 130, and portions of the temperature measurement system 132.

Provisions for gas handling, low pressure operation and wafer exchange are provided in the RTP wafer process chamber 136. Wafers 50 (shown as dashed line) are supported in the chamber 136 by a silicon carbide support ring 140 that contacts only the outer edge of the wafer 50. The ring is mounted on a quartz cylinder 142 that extends into the chamber bottom where it is supported by a bearing (not shown). The bearing is magnetically coupled to an external motor (not shown) that is used to rotate the wafer 50 and assembly (i.e., ring, quartz cylinder, etc.). Temperature measurement probes connected to fiber optics 144 are mounted in the chamber bottom as shown in FIG. 3. The architecture of this RTP chamber system provides flexibility to modify the chamber materials and design to accommodate process requirements and wafer types while the design of the radiant heat source and temperature measurement and control system remain essentially unchanged. A detailed description of these components follows.

The lamp head 130 is made of a honeycomb of tubes 146 in a water jacket housing or assembly 148. Each tube 146 contains a reflector and a tungsten halogen lamp assembly which forms a honeycomb light pipe arrangement 150. This close packed hexagonal arrangement of collimating light pipes provides the radiant energy sources with high power density with good spatial resolution of the lamp outputs. Wafer rotation is used to smooth lamp to lamp variations thus eliminating the need to match lamp performance.

Continuing with reference to FIG. 3, a quartz window 152 separates the lamp head 130 from the chamber 136. Typically, a thin window of about 4 millimeters (mm) is used which reduces the "thermal memory" by minimizing the absorbing thermal mass. The window 152 is cooled by contact with the lamp head 130. For reduced pressure operation, window 152 may be replaced by an adapter plate (not shown).

An important aspect of the lamp head 130 design for reliable wafer processing in a manufacturing environment is the robustness as a radiant heat source. The lamp head system 130 is designed with sufficient reserve so that the lamps 150 can be operated well below their rated values. The use of a large number of lamps in this design (an embodiment typically has 187 lamps for 200 mm wafer size) results in a lamp redundancy. If a lamp fails during operation in any one zone, the multi-point closed loop control will maintain the temperature set points. The use of wafer rotation averages out local intensity variations that may occur such that no degradation of process performance will occur.

Rapid thermal processing of the deposited BPSG film layer may be performed in a wet (e.g., steam, $H_2O$) ambient, a wet ambient formed by in-situ reaction of $H_2$ and $O_2$, or a combination thereof. As indicated in FIG. 3, in an embodiment, a hydrogen supply 154 and an oxygen supply 156 are coupled to the RTP chamber 14. As mentioned above, annealing the deposited BSG and BPSG layers/films may be performed using the exemplary RTP chamber shown in FIG. 3 or using furnace heating (for batch processing).

Figure 4:
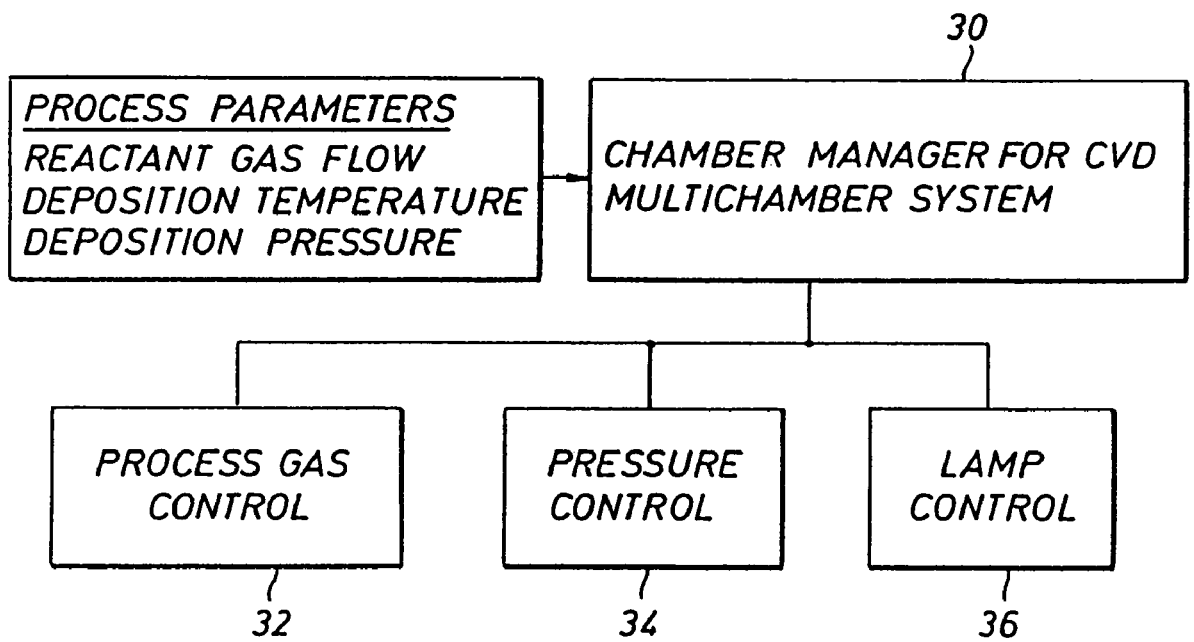
FIG. 4 illustrates an example embodiment of a hierarchy of a system control computer program stored in memory of a system controller of multichamber system of FIG. 1.

With reference to FIGS. 1 and 4, the multichamber system 10 further includes a system controller 20 that controls all of the activities of the multichamber CVD system. In an embodiment of the present invention the system controller 20 includes a hard disk drive (memory 22), a floppy disk drive and a processor 24. An input/output device 26 such as a CRT monitor and a keyboard is used to interface between a user and controller 20.

System controller 20 executes system control software, which is a computer program stored in a computer-readable medium such as a memory 22. Preferably, memory 22 is a hard disk drive, but memory 22 may also be other kinds of memory. The computer program includes sets of instructions that dictate the timing, mixture of gases, chamber pressure, chamber temperature, lamp power levels, susceptor position, and other parameters of a particular process. Of course, other computer programs such as one stored on another memory device including, for example, a floppy disk or other another appropriate drive, may also be used to operate controller 20.

The process for depositing and reflowing (i.e., annealing) the boron-rich silicon glass film and BPSG film can be implemented using a computer program product which is stored in memory 22 and is executed by controller 20. The computer program code can be written in any conventional computer readable programming language, such as, 68000 assembly language, C, C ++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant complier code is then linked with an object code of precompiled windows library routines. To execute the linked compiled object code, the system user invokes the object code, causing the computer system to load the code in memory, from which the CPU reads and executes the code to perform the tasks identified in the program. Also stored in memory 22 are process parameters such as reactant gas flow rates and composition, temperatures and pressure necessary to carry out the deposition and reflow of a boron rich or a boron-phosphorous doped amorphous or polycrystalline silicon film in accordance with the present invention.

FIG. 4 illustrates an example embodiment of a hierarchy of a system control computer program stored in memory 22 of a system controller 20 of multichamber system of FIG. 1. The system control program includes a chamber manager subroutine 30. The chamber manager subroutine 30 also controls execution of various chamber component subroutines which control the operation of the chamber components necessary to carry out the selected process set. Examples of chamber component subroutines are process reactant gas control subroutine 32. Those having ordinary skill in the art would readily recognize that other chamber control subroutines can be included depending on what processes are desired to be performed in the process chambers 12, 14, 16, 18. In operation, the chamber manager subroutine 30 selectively schedules or calls the process component subroutines in accordance with the particular process set being executed. Typically, the chamber manager subroutine 30 includes steps of monitoring the various chamber components, determining which components needs to be operated based on the process parameters for the process set to be executed and causing execution of a chamber component subroutine responsive to the monitoring and determining steps.

The reactant gas control subroutine 32 has program code for controlling reactant gas composition and flow rates. The reactant gas control subroutine 32 controls the open/close position of the safety shut-off valves, and also ramps up/down the mass flow controller to obtain the desired gas flow rate. The reactant gas control subroutine 32 is invoked by the chamber manager subroutine 30, as are all chamber component subroutines and receives from the chamber manager subroutine process parameters related to the desired gas flow rates. Typically, the reactant gas control subroutine 32 operates by opening the gas supply lines, and repeatedly (i) reading the necessary mass flow controllers, (ii) comparing the readings to the desired flow rates received from the chamber manager subroutine 30, and (iii) adjusting the flow rates of the gas supply lines as necessary. Furthermore, the reactant gas control subroutine 32 includes steps for monitoring the gas flow rates for unsafe rates, and activating the safety shut-off valves when an unsafe condition is detected.

The pressure control subroutine 34 comprises program code for controlling the pressure in chamber(s) 12, 14, 16, and/or 18 by regulating the size of the opening of the throttle valve is set to control the chamber pressure to the desired level in relation to the total process gas flow, size of the process chamber, and pumping set point pressure for the exhaust system. When the pressure control subroutine 34 operates to measure the pressure in chamber(s) 12, 14, 16, and/or 18 by reading one or more conventional pressure nanometers connected to the chamber(s), compare the measure value(s) to the target pressure, obtain PID (proportional, integral, and differential) values from a stored pressure table corresponding to the target pressure, and adjust the throttle valve(s) according to the PID values obtained from the pressure table. Alternatively, the pressure control subroutine 34 can be written to open or close the throttle valve to a particular opening size to regulate the chamber(s) 12, 14, 16, and/or 18 to the desired pressure.

The lamp control subroutine 36 comprises program code for controlling the power provided to substrate support member (e.g. susceptor) and lamps in chambers 12 and 14 which are used to heat the substrate 50. The lamp control subroutine 36 is also invoked by the temperature parameter. The lamp control subroutine 36 measures the temperature by measuring voltage output of the temperature measurement devices directed at the substrate support member (item 110 in FIG. 2) compares the measured temperature to the setpoint temperature, and increases or decreases power applied to the lamps to obtain the setpoint temperature.

Applicants have stored in a program, code of the process of forming an insulating film on a substrate to reduce nitride consumption. The computer-readable program includes instructions to control a gas delivery system to provide a silicon source, an oxygen source and a boron source into the reaction chamber while delaying providing a phosphorous source into the reaction chamber to form a borosilicate glass layer over a nitride layer present on a substrate positioned in the chamber. The computer-readable program further includes instructions to provide the phosphorous, silicon, oxygen and boron sources into the reaction chamber to form a borophosphosilicate film over the borosilicate glass layer.

Figure 5:
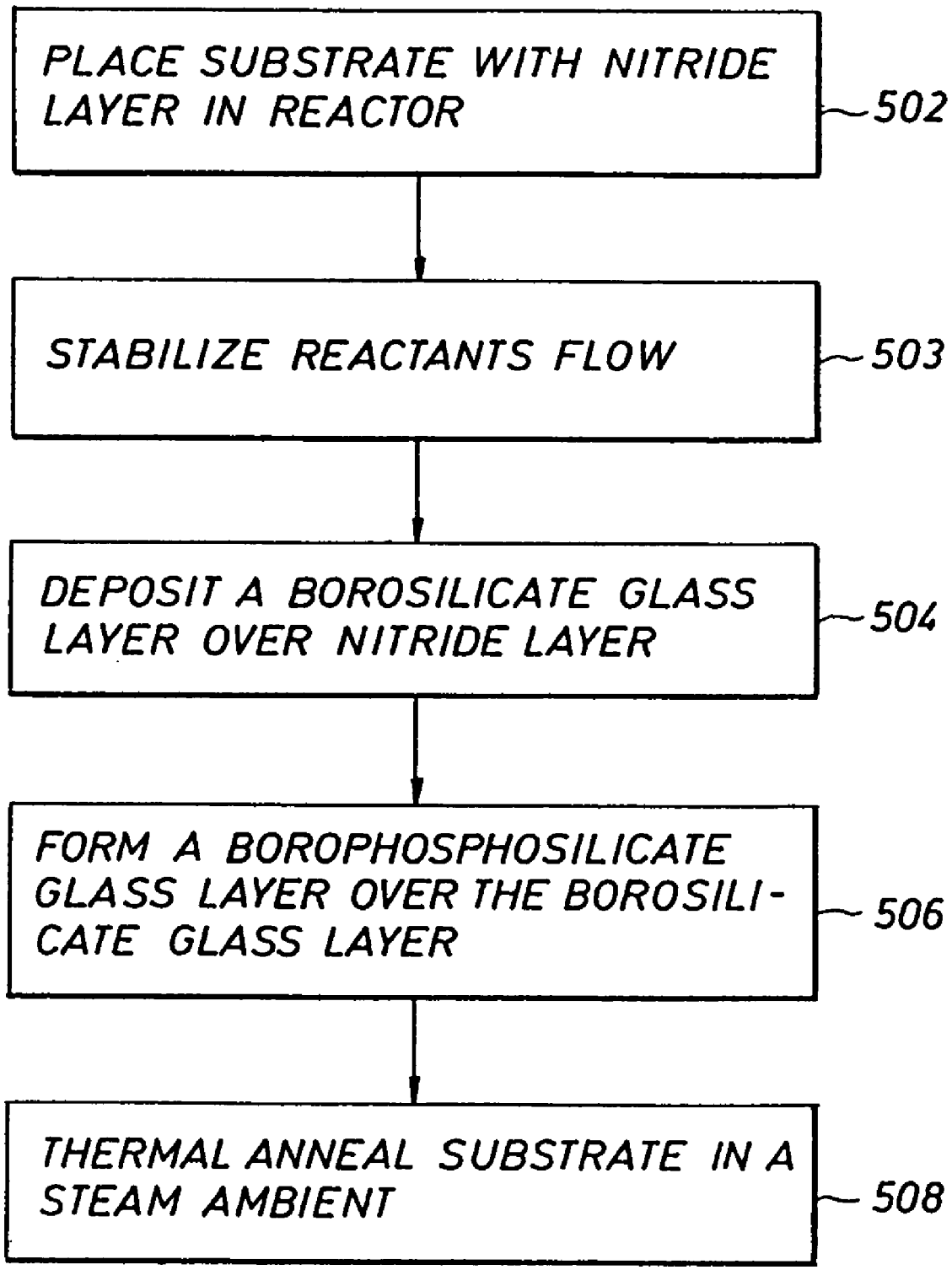
FIG. 5 outlines a method for selectively controlling dopant concentration during borophosphosilicate glass film deposition on a semiconductor wafer to reduce nitride consumption according to an embodiment of the present invention.
Figure 6:
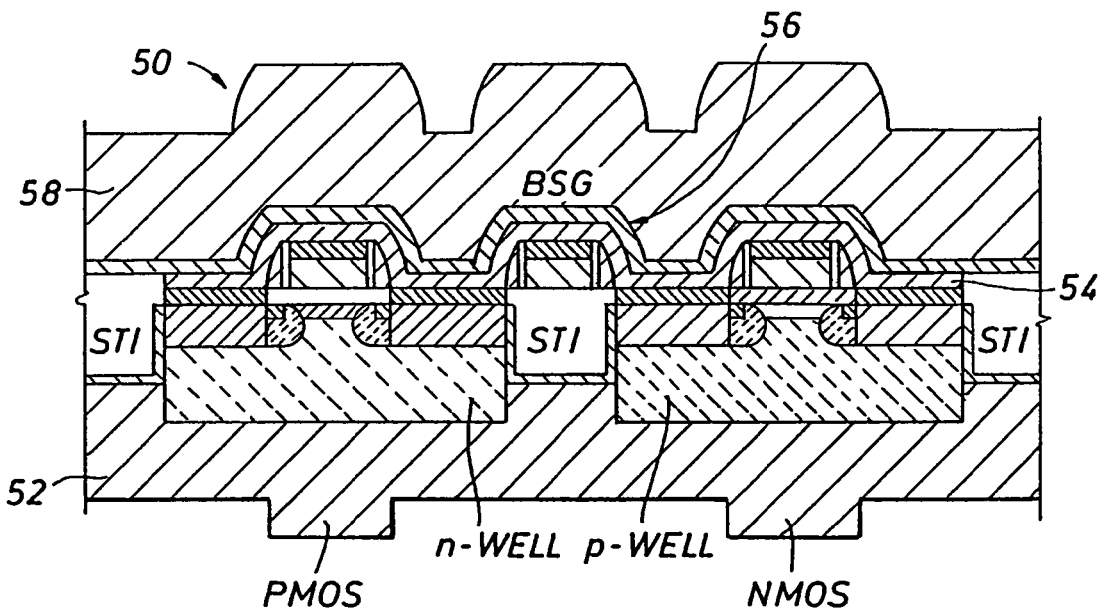
FIG. 6 is a simplified, cross-sectional view of a substrate with a nitride layer and having a BSG film and a BPSG film controlled deposited to reduce nitride consumption according to an embodiment of the present invention.

With reference to FIGS. 5 and 6, a method for selectively controlling dopant concentration during borophosphosilicate glass film deposition on a semiconductor wafer to reduce nitride consumption according to an embodiment of the present invention is described. According to the present invention, a silicon substrate/wafer (item 52 in FIG. 6) having a silicon nitride barrier layer (item 54 in FIG. 6) is placed in a reaction chamber (see block 502 in FIG. 5).

A silicon source, an oxygen source, a boron source and a phosphorous source are selectively provided into the reaction chamber system. As described above, the reaction chamber system includes a gas delivery system (item 108 in FIG. 2) that may be operated in a process mode or a divert mode. Therefore, the reaction chamber system can inject some of the selected reactants (e.g. TEOS, TEB) while delaying injecting other reactants (e.g., TEPO) in order to control-deposit a boron rich glass film on a substrate. Moreover, the reaction chamber system can inject all of the reactants (e.g., TEOS, TEB, TEPO, etc.) in the reaction chamber for substrate processing to control-deposit a doped BPSG film on the substrate. The gas delivery system also stabilizes reactants' flows prior to introducing them in the chamber (block 503 of FIG. 5).

At block 504 of FIG. 5, the method continues by providing or injecting the stabilized silicon, oxygen and boron sources into the reaction chamber while delaying providing or injecting the phosphorous source (e.g., TEPO) in the chamber for a predetermined period of time to form or deposit a borosilicate glass (BSG) or boron-rich silicon glass film (56 in FIG. 6) over the nitride barrier layer on the substrate. In an embodiment of this invention, the predetermined period of time for delaying injecting the phosphorous source in the chamber is in a range of approximately 3-30 seconds, and preferably about 10 seconds.

Next, (block 506 of FIG. 5) the phosphorous source is injected in the chamber while continuing injecting the silicon, oxygen and boron sources into the chamber to deposit a borophosphosilicate glass (BPSG) film (58 in FIG. 6) over the borosilicate glass film.

Following film deposition, the substrate (50 in FIG. 6) having the boron-rich silicon glass film and BPSG film deposited thereon is annealed in a furnace at a temperature in a range of approximately 750° C. to 1050° C. in a wet ambient of steam or water, or a wet ambient formed by in-situ reaction of $H_2$ and $O_2$, to facilitate reflow of the BPSG film (i.e., planarize film layer and fill gap/voids in film) and nitride consumption (block 508 in FIG. 5). Annealing/reflowing the BPSG film may be performed in any type of thermal furnace used in substrate processing, and preferably is preformed in a RTP chamber described above. The boron-rich silicon film deposited between a BPSG film and the nitride barrier layer acts as a diffusion layer to slow down reactions during steam anneal between nitride and phosphorous.

In an exemplary embodiment process recipe, for a 200 mm system, the flow rate of TEB is preferably in a range of approximately 100-300 milligrams per minute (mgm), and preferably about 200 mgm. The flow rate of TEPO is in a range of approximately 10-150 mgm, preferably about 10 mgm, depending on the desired dopant concentration, while the TEOS flow rate is in a range of approximately 200-1000 mgm, preferably about 600 mgm. The vaporized TEOS, TEB, and TEPO gases then are mixed with a helium carrier gas flowing at a rate in a range of approximately 2000-8000 standard cubic centimeters (sccm), preferably at a rate of about 6000 sccm. Oxygen in the form of $O_3$ is introduced at a flow rate in a range of approximately 2000-6000 sccm and is preferably introduced at a flow rate of about 4000 sccm. The ozone mixture contains between about 5-20 weight percent (wt %) oxygen.

The above conditions result in a BSG or boron-rich layer/film having a thickness sufficient to prevent phosphorous reaction with the nitride barrier layer. In an embodiment, the BSG layer has a thickness in a range of approximately 75-150 Angstroms (Å). By controlling the deposition time, such as the predetermined period of time to delay phosphorous injection into the reaction chamber, the thickness of the BSG film deposited may thus be easily controlled.

The above conditions also result in a BPSG film deposited at a rate of between 2000-6000 Angstroms per minute (Å/min). The thickness of the BPSG layer/film for pre-metal dielectric applications may range from 2000-20000 Å. By controlling the deposition time, the thickness of the BPSG film deposited may thus be easily controlled. The resulting BPSG film has a boron concentration level in a range of approximately 2-5 wt % and a phosphorus concentration level in a range of approximately 2-9 wt % for a combined total weight percent of boron and phosphorous concentrations in the BPSG film/layer of about 10 wt %. In an embodiment, the resulting BPSG film has a boron concentration level of about 3 wt % and a phosphorus concentration level of about 7 wt %.

Figure 7:
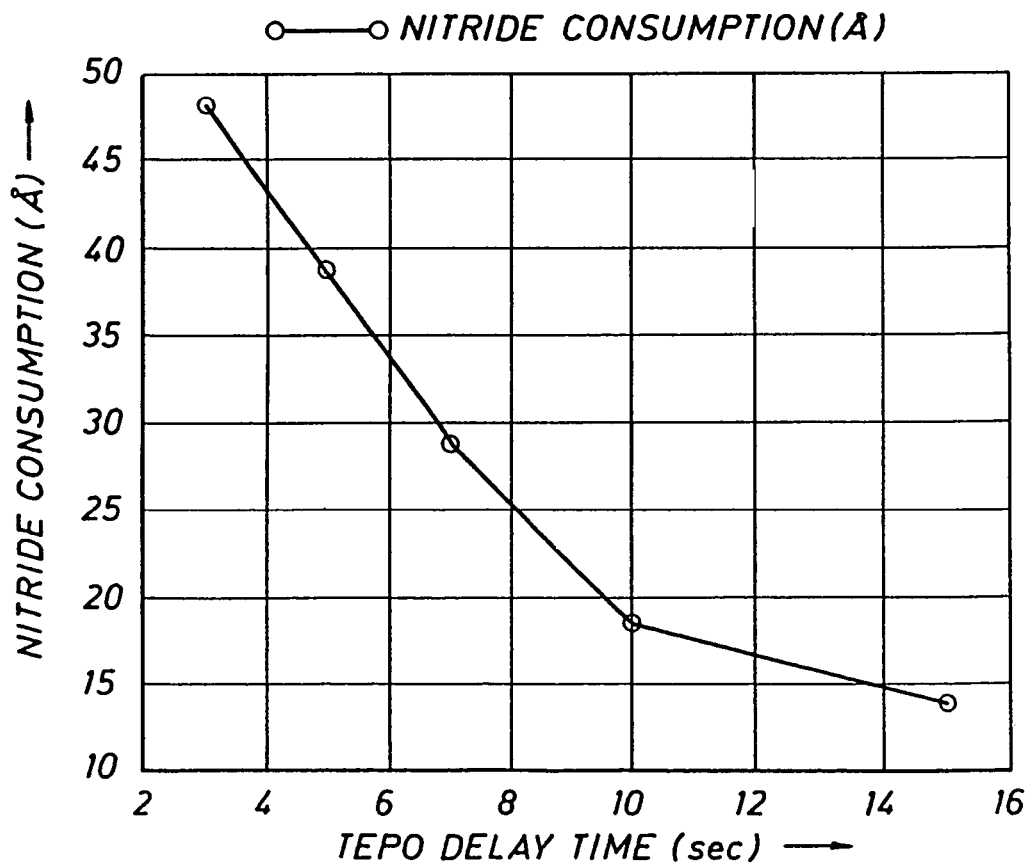
FIG. 7 shows experimental results of nitride consumption versus TEPO injection delay times obtained using the method and apparatus of this invention.

With reference to FIG. 7, experiments conducted by inventors using the method and apparatus of the present invention indicate that nitride consumption is reduced with increased TEPO source injection delay time (increased thickness of the BSG film). For a particular substrate processing system and CVD film deposition recipe, a predetermined TEPO injection delay time of about 10 seconds adequately met a target requirement of 15-20 Angstroms (Å) of nitride consumption for a deposited and reflowed BPSG film with void free gap-fill.

It should be noted that the predetermined period of time for delaying providing or delay injecting the phosphorous source into the reaction chamber time is typically selected relative to a desired nitride layer consumption amount and phosphorous and boron source concentrations present in the borophosphosilicate glass layer. Furthermore, the predetermined period of time to delay injecting a phosphorous source in the CVD chamber along with other reactants and carrier gases during borophosphosilicate glass film deposition (and thus first forming a BSG film over the nitride barrier layer) depends on a number of factors, including but not limited to, specific substrate processing recipe (e.g., reactant/carrier injection flow rates, reactant types) used by the integrated circuit manufacturer, the particular characteristics of the CVD chamber system used (e.g., film deposition rates, rapid annealing temperature ramping capability, the configuration of the gas delivery system), and other factors known in the art of integrated circuit manufacture.

By adjusting the delay time at which phosphorous is introduced into the chamber for deposition, a boron rich layer may be formed into the stack between the BPSG and nitride layers to act as a diffusion layer to slow down reactions during steam anneal between nitride and phosphorous.

Thus, a method and apparatus for selectively controlling dopant concentration during borophosphosilicate glass film deposition on a semiconductor wafer to reduce nitride consumption have been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

We claim:

1. A method to control nitride consumption during integrated circuit manufacture, the method comprising:
    placing a substrate having a nitride layer in a reaction chamber;
    providing a silicon source, an oxygen source, a boron source and a phosphorous source;
    injecting the silicon, oxygen and boron sources into the reaction chamber while delaying injecting the phosphorous source in the reaction chamber for a predetermined period of time to deposit a boron-rich silicate glass film over the nitride layer;
    injecting a predetermined amount of the phosphorous source in the reaction chamber following the predetermined period of time while continuing injecting the silicon, oxygen and boron sources into the reaction chamber to deposit a borophosphosilicate film over the boron-rich silicate glass film, wherein the borophosphosilicate glass layer comprises approximately 2-9 weight percent of phosphorous; and
    annealing the borophosphosilicate glass layer to consume at least a portion of the nitride layer, wherein the predetermined period of time for delaying injecting the phosphorous source and the predetermined amount of the phosphorous source are selected relative to the desired nitride layer consumption.

2. The method of claim 1, wherein the predetermined period of time to deposit a boron-rich silicate glass film over the nitride layer is in a range of approximately 3-30 seconds.

3. The method of claim 1 wherein the desired nitride layer consumption is in the range of 15-20 Angstroms of the nitride layer.

* * * * *

UNITED STATES PATENT AND TRADEMARK OFFICE
CERTIFICATE OF CORRECTION

PATENT NO.       : 7,638,161 B2                                                   Page 1 of 1
APPLICATION NO.  : 09/910583
DATED            : December 29, 2009
INVENTOR(S)      : Mukai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1064 days.

Signed and Sealed this

Ninth Day of November, 2010

David J. Kappos
*Director of the United States Patent and Trademark Office*